United States Patent [19]

Okamura et al.

[11] Patent Number: 4,842,759

[45] Date of Patent: Jun. 27, 1989

[54] ACICULAR PROCESS FOR PRODUCING PARTICULATE MATERIAL

[75] Inventors: Kazuo Okamura, Itami; Ikuo Kitamura, Kyoto; Hideki Aomi; Satoshi Koyama, both of Osaka; Katsushi Tokunaga, Habikino; Yoshiyuki Shibuya; Shiego Daimon, both of Osaka, all of Japan

[73] Assignee: Daikin Industries, Ltd., Osaka, Japan

[21] Appl. No.: 918,783

[22] Filed: Oct. 14, 1986

Related U.S. Application Data

[63] Continuation-in-part of Ser. No. 790,238, Oct. 22, 1985, and a continuation-in-part of Ser. No. 790,237, Oct. 22, 1985, and a continuation-in-part of Ser. No. 909,008, Sep. 16, 1986, which is a continuation of Ser. No. 603,080, Apr. 23, 1984, abandoned.

[30] Foreign Application Priority Data

| Apr. 25, 1983 | [JP] | Japan | 58-73251 |
| Jul. 5, 1983 | [JP] | Japan | 58-122879 |
| Sep. 17, 1983 | [JP] | Japan | 58-171765 |
| Nov. 17, 1983 | [JP] | Japan | 58-217530 |
| Dec. 7, 1983 | [JP] | Japan | 58-231876 |
| Dec. 7, 1983 | [JP] | Japan | 58-231875 |
| Dec. 14, 1983 | [JP] | Japan | 58-236753 |
| Dec. 28, 1983 | [JP] | Japan | 58-250163 |
| Jan. 23, 1984 | [JP] | Japan | 59-10400 |
| Oct. 25, 1984 | [JP] | Japan | 59-224968 |
| Oct. 25, 1984 | [JP] | Japan | 59-224967 |

[51] Int. Cl.$^4$ ............................................. C01B 31/30

[52] U.S. Cl. ............................... 252/62.51; 252/62.56; 423/439

[58] Field of Search ......................... 252/62.51, 62.56; 423/439

[56] References Cited

U.S. PATENT DOCUMENTS

| 2,535,042 | 12/1950 | Cohn et al. | 423/439 |
| 3,572,993 | 3/1971 | Rogers | 423/439 |
| 3,748,270 | 7/1973 | Hwang | 252/62.56 |
| 3,885,023 | 5/1975 | Gray et al. | 423/439 |
| 4,033,891 | 7/1977 | Matsui et al. | 252/62.56 |
| 4,137,342 | 1/1979 | Kanten | 252/62.56 |
| 4,668,414 | 5/1987 | Okamura et al. | 252/62.51 |

FOREIGN PATENT DOCUMENTS

| 900884 | 4/1985 | Belgium . | |
| 44-18574 | 8/1969 | Japan | 423/439 |

OTHER PUBLICATIONS

Beaulieu et al., "Canadian Metallurgical Quarterly", vol. 12, No. 3 (1973) pp. 265–270.

*Primary Examiner*—Jack Cooper
*Attorney, Agent, or Firm*—Armstrong, Nikaido, Marmelstein, Kubovcik & Murray

[57] ABSTRACT

The present invention relates to novel acicular particles, processes for using the same, and magnetic materials prepared from such particles. In particular, the invention relates to an acicular particulate material containing iron carbide and having a high coercive force(Hc) an orientation property in a magnetic field.

5 Claims, No Drawings

ACICULAR PROCESS FOR PRODUCING PARTICULATE MATERIAL

CROSS-REFERENCE TO RELATED APPLICATIONS

This application is a continuation-in-part application of our copending applications Ser. No. 790,238, filed Oct. 22, 1985, now abandoned Ser. No. 790,237, filed Oct. 22, 1985, now abandoned and Ser. No. 909,008, filed Sept. 16, 1986, now abandoned which is a continuation of Ser. No. 603,080, filed Apr. 23,1985 now abandoned.

The present invention has several aspects. In one aspect, the present invention relates to novel acicular particles, a process for producing the same and magnetic materials prepared from such particles. More particularly, the invention relates to an acicular particulate material containing iron carbide and having a high coercive force and orientation property in magnetic field.

The invention also relates to a magnetic coating composition and magnetic recording medium containing the above magnetic materials.

Hitherto, acicular particles usually containing an iron oxide as the base are used for magnetic materials for magnetic recording. These particles have a coercive force (Hc) of up to about 400 Oe. In recent years, however, there is a demand for magnetic materials of improved performance, i.e. enhanced coercive force which enables them to record signals at a higher density per unit volume of magnetic materials. Some materials already known and somehow meeting such demand include particulate metallic iron obtained by reducing an acicular iron oxide with hydrogen and a modified acicular particulate iron oxide with cobalt. The former, which is chemically so active as to be readily oxidized in the atmosphere, requires special care during manufacture, storage and transport, is therefore cumbersome to handle and is very expensive. The latter, which contains cobalt, is not only expensive but also chemically and thermally unstable because the material has its coercive force varied with lapse of time and because the variation is promoted by changes in temperature.

An object of the present invention is to provide acicular particles having a high coercive force and outstanding magnetic field orientation and a magnetic material containing such particles.

Another object of the invention is to provide acicular particles which are chemically and thermally stable and easy to handle and a magnetic material containing such particles.

Another object of the invention is to provide acicular particles which are inexpensive and easy to produce and a magnetic material containing such particles.

Still another object of the invention is to provide a magnetic coating composition and magnetic recording medium containing the magnetic material.

The above and other objects of the invention will become apparent from the following description.

Thus, the present invention provides acicular particles containing iron carbide and a magnetic material comprising such particles. These acicular particles are prepared by contacting, for example, an acicular iron oxyhydroxide or acicular iron oxide with CO or with a mixture of CO and $H_2$.

Although iron carbide is known to be a magnetic material, the iron carbide is in the form of spherical particles which are in no way commercially feasible. U.S. Pat. No. 3,572,993 discloses that iron carbonyl is brought into contact with CO or with a mixture of CO and $H_2$ to obtain spherical iron carbide particles having an average diameter of about 0.005 to 0.1 $\mu$m and usable as a magnetic recording material. Although having a relatively high coercive force of 500 to 700 Oe(iHc), the material, which is in the form of spherical particles, have no magnetic field orientation and is not suited to the production of magnetic recording media having a satisfactory square ratio(Br/Bm or $\sigma r/\sigma m$).

The acicular particles of the present invention have the following characteristics.

First, they have a high coercive force, for example, as much as 1000 Oe.

Second, they have magnetic field orientation, whereby the material is made to have a magnetic hysteresis curve of improved square ratio. Thus, the particles are useful for giving magnetic recording media having a high residual flux density.

Third, they are stable chemically and thermally. Unlike metallic iron particles, the acicular particles of the present invention are free of oxidation by air and are chemically stable. Further unlike the iron oxide modified with cobalt, the acicular particles of the invention are free of variations with time and are much more stable in properties, e.g. coercive force. Accordingly the present particles are easy to handle, do not deteriorate during storage or transport and are expected to retain a stable quality when used as a recording material.

Fourth, they are inexpensive. The acicular particles of the invention do not require special care in handling unlike acicular metallic iron particles and are therefore available at a low cost. Unlike the cobalt-modified iron oxide, the present particles need not always contain expensive cobalt at an essential component.

Fifth, they can be produced easily. For the preparation of the present material, acicular iron oxyhydroxide or acicular iron oxide, for example, can be brought into contact with CO under mild conditions such as a contact temperature of up to 400° C.

Sixth, the acicular particles of the present invention produced from acicular iron oxyhydroxide or acicular iron oxide have a higher coercive force than an acicular iron oxide derived from such material, e.g. acicular $Fe_3O_4$, or acicular $Fe_2O_3$ compacted by reoxidizing the $Fe_3O_4$. Thus, the present particulate material has improved magnetic characteristics over acicular iron oxides.

The acicular particles of the invention are usually at least 3, preferably 3 to 20, in an average axial ratio (long axis/short axis or length/width) of primary particles and are usually up to 2 $\mu$m, preferably 0.1 to 2 $\mu$m, most preferably 0.1 to 1.0 $\mu$m, in average particle size (long axis or length).

The term "primary particles" herein used refers to particles which can be recognized as such when observed under an electron microscope (3000 to 6000×). For example, FIG. 1, which is an electron photomicrograph (6000×) showing the structure of acicular particles of the invention, reveals that bundles of fine slender particles lap over one another. The individual fine slender particles constituting each bundle are primary particles.

The iron carbide contained in the acicualr particles of the invention is one of $Fe_5C_2$, $Fe_2C$ and $Fe_{20}C_9$ ($Fe_{2.2}C$) or a mixture of at least two of these iron carbides. It is suitable to represent the iron carbide as $Fe_xC$ ($2 \leq X < 3$). Generally the presence of an iron carbide in a material can be detected by examining the X-ray diffraction pattern of the material with reference to the known X-ray diffraction patterns of the known iron carbides represented by chemical formulae (e.g. those on X-Ray Powder Data File of ASTM). However, since the difference in X-ray diffraction pattern between individual iron carbides is very small, an iron carbide as the main component can be identified but it is almost impossible to identify other iron carbides which are present in very small amounts although the very small amounts of iron carbides present do not influence the magnetic characteristics, etc. and may be neglected. Preferably the main iron carbide is one exhibiting plane spacings(D-values) at 2.28Å, 2.20Å, 2.08Å, 2.05Å and 1.92Å in the X-ray diffraction pattern. Such ironcarbide corresponds to $Fe_5C_2$. This iron carbide is sometimes present conjointly with $Fe_2C$, $Fe_{20}C_9$ ($Fe_{2.2}C$), $Fe_3C$, etc.

Preferably, the acicular particles of the invention contain at least 20 wt. % of iron carbide, then they have a coercive force of at least 450 Oe. More preferably, the acicualr particles of the invention contain at least 50 wt. % of iron carbide, then they have a coercive force of at least 850 Oe. As already stated, it is almost impossible to identify all the iron carbides contained in the present particles, and it is also generally impossible to isolate these iron carbides. For the determination of the iron carbide content, therefore, the chemical formula of the iron carbide which can be identified as the main component is determined, and when required, the chemical formulae of other components are determined, for example, as $Fe_3O_4$, etc. The content is generally determined in view of these formulae, the result of elementary analysis and the weight gain on ignition.

The acicular particles of this invention include those composed only of iron carbide(s) and those further containing other components. The components other than iron carbides are those derived from the starting material, such as iron oxide, those resulting from the production process, such as elemental carbon, and others derived from additives, such as carbides or oxides of copper, magnesium, manganese, nickel, cobalt and the like, carbonates or oxides of potassium, sodium and the like and/or oxides of silicon and the like.

Preferably the acicular particles of the present invention is produced by contacting an acicular iron oxyhydroxide or acicular iron oxide with CO or with a mixture of CO and $H_2$.

The starting acicular iron oxyhydroxides or acicular iron oxides can be those usually at least 3, preferably 3 to 20, in average axial ratio and having an average particle size (long axis) of usually at least 2 μm, preferably 0.1 to 2 μm, most preferably 0.1 to 1.0 μm. As will be described later, the acicular particles produced are slightly smaller than, but almost unchanged from, the starting material in average axial ratio and inaverage particle size, so that the acicular particles of the invention in general preferably have such sizes as already stated.

Examples of preferred acicular iron oxyhydroxides are acicular α-FeOOH (goethite), β-FeOOH (akaganite) and acicular γ-FeOOH (lepidocrosite). Examples of preferred acicular iron oxides are acicular $\alpha$-$Fe_2O_3$ (hematite), acicular γ-$Fe_2O_3$ (maghemite) and acicular $Fe_3O_4$ (magnetite).

Acicular α-$Fe_2O_3$ or acicular γ-$Fe_2O_3$ is, for example, any of one prepared by heating acicular α-FeOOH or acicular γ-FeOOH at about 200° to about 350° C., followed by dehydration, acicular α-$Fe_2O_3$ prepared by heating the resulting product further at about 350° to about 900° C. to compact the crystals, and others.

The above-mentioned acicular $Fe_3O_4$ can be prepared by contacting an acicular iron oxide other than acicular $Fe_3O_4$ or acicular iron oxyhydroxide with CO, $H_2$ or a mixture thereof, although the $Fe_3O_4$ is not limited to one prepared in those methods. When CO or a mixture of CO and $H_2$ is contacted with an acicular iron oxyhydroxide or acicular iron oxide other than acicular $Fe_3O_4$ to prepare acicular $Fe_3O_4$, the same contact conditions as those in the preferred production process of the invention can also be employed except for the time condition. In this case, the acicular $Fe_3O_4$ formed can be subsequently held in contact with the gas under the same conditions as in the preceding reaction without any interruption to obtain the desired acicular particulate material of the invention.

The starting material to be used for the preferred process for producing acicular particles according to the invention may have added thereto a small amount or small amounts of a compound, such as oxide or carbonate of copper, magnesium, manganese, nickel or cobalt, silicon oxide, potassium salt, sodium salt, etc., insofar as the starting material is acicular and chiefly comprises an iron oxyhydroxide or iron oxide.

The starting acicular iron oxyhydroxide or iron oxide preferably has a pH of at least 5 on the surface thereof. In this case are produced acicular particles having a higher coercive force. The acicular iron oxyhydroxide and iron oxide are preferable insofar as they have a pH of the above range, without regard to methods of preparation thereof. Thus, the starting iron compound having a pH of at least 5 just after the preparation can be used. Also, the starting material having a pH of less than 5 can be used after it is increased to at least 5 in pH by contact with an aqueous solution of an alkali compound (e.g., sodium hydroxide, potassium hydroxide, ammonium hydroxide). The pH is measured in a usual method of measuring pH of solid surface. For example, one of methods is described on page 159 of "Coating and Pigment" published by Nikkan Kogyo Sinbun-sha. Specifically stated, 5 g of the starting iron compound is boiled in 100 cc of distilled water for one hour, the mixture is cooled to room temperature and allowed to place for one hour. The pH of a supernatant layer is measured by a pH meter.

CO or a mixture thereof with $H_2$ can be used as it is or as diluted. Examples of diluents are $N_2$, $CO_2$, argon, helium, etc. When the mixture of CO and $H_2$ is used, the mixing ratio CO/$H_2$ is preferably 1/0.05 to 1/5 by volume. The dilution ratio is preferably about 1.1 to about 10 times (by volume). The contact temperature, contact time, flow rate of CO or mixture thereof with $H_2$ and other conditions depend, for example, on the production history, average axial ratio, average particle size and specific surface area of the acicular iron oxyhydroxide or acicular iron oxide, dilution ratio of CO or mixture thereof, etc. The preferred contact temperature is about 250° to about 400° C., preferably about 300° to about 400° C. The preferred contact time is about 1 to about 10 hours for acicular $Fe_3O_4$. The $Fe_3O_4$ prepared from other acicular iron oxide or acicular iron oxyhydroxide by reduction is preferably further heated for about 1 to about 10 hours. The preferred flow rate of CO or mixture thereof with $H_2$ is about 1 to about 1000 ml S.T.P./min per gram of acicular iron oxyhydroxide or like starting material. When diluted CO or mixture thereof with $H_2$ is used, the contact pressure inclusive of that of the diluent is usually 1 to 2 atom, although not limitative particularly.

The particulate material obtained by the preferred production process are in the form of generally uniform acicular particles as seen in FIG. 1 when observed under an electron microscope. The particles are present as primary particles and have the same acicular particulate form as the starting particles of acicular iron oxyhydroxide or acicular iron oxide. The acicular particles obtained by the preferred process are found to contain carbon by elementary analysis and to contain an iron carbide by its X-ray diffraction pattern, which exhibits plane spacings at 2.28Å, 2.20Å, 2.08Å, 2.05Å and 1.92Å. Such pattern corresponds to $Fe_5C_2$. The iron carbide component of the present material chiefly comprises $Fe_5C_2$, with $Fe_2C$, $Fe_{20}C_9$ ($Fe_{2.2}C$), $Fe_3C$, etc. present conjointly therewith in some cases.

In the event of incomplete carbonization, the acicular particles obtained by the preferred process further contain an iron oxide component which is chiefly $Fe_3O_4$. With respect to iron oxides, FeO, $Fe_3O_4$ and $\gamma$-$Fe_2O_3$ are generally related to one another in structure. The oxygen atoms in these three oxides are packed in a three-dimensional structure to the highest possible density, and the number of oxygen atoms in $Fe_3O_4$ actually present varies in an overall range covering the numbers of oxygen atoms in these oxides, so that it is suitable to represent the iron oxide in the acicular particles by $FeO_y$ ($1 < y \leq 1.5$).

While the acicular particles prepared by the preferred process contain iron oxide in addition to the iron carbide component in most cases, the elementary analysis values of C, H and N indicate that the amount of carbon is usually excess of that calculated from the chemical formula of the iron carbide identified by the X-ray diffraction pattern. It is not clear whether the excess of carbon is present as combined with iron or as free carbon. In this sense, it is probable that the acicular particles obtained by the preferred process contain elemental carbon. The particles obtained by the preferred process then include acicular particles at least 3 in average axial ratio with respect to their shape as primary particles and composed substantially of iron carbide alone or iron carbide and iron oxide and/or elemental carbon.

The iron carbide and iron oxide contents of the acicular particles obtained by the preferred process can be determined from the chemical formulae $Fe_5C_2$ and $Fe_3O_4$, which are confirmed as the main iron carbide and iron oxide components by X-ray diffraction analysis, the result of elementary analysis and the weight gain on ignition. The iron carbide content is preferably at least 20 wt %, more preferably at least 50 wt %. The iron oxide content is preferably up to 70 wt %, more preferably up to 40 wt %.

The acicular particles obtained by the preferred process are slightly smaller than but almost the same as the starting particles, namely acicular iron oxyhydroxide or acicular iron oxide, in average axial ratio and average particle size. Accordingly the acicular particles prepared by the present process have an average axial ratio usually of at least 3, preferably 3 to 20, and an average particle size (long axis) usually of up to 2 µm, preferably 0.1 to 2 µm, most preferably 0.1 to 1.0 µm.

The acicular particles obtained by the preferred process are formed by a solid-vapor reaction wherein an acicular iron oxyhydroxide or a acicular iron oxide is brought into uniform contact with CO or a mixture thereof with $H_2$. Further, the acicular particles formed have nearly the same shape as the acicular starting material. Therefore, in case of containing iron oxide, it appears that the iron carbide or the iron carbide and elemental carbon in the product are wholly or predominantly present on the surfaces of the particles and that the iron oxide is wholly or predominantly present in the interior of the particles.

While acicular particles of the invention containing iron carbide have a high coercive force and magnetic field orientation, it is more preferable to treat the surface thereof with a surface-treating agent to improve square ratio.

Examples of surface-treating agents are as follows:

(1) silane coupling agents such as $\gamma$-amino-propyltriethoxysilane, N-($\beta$-aminoethyl)-$\gamma$-aminopropyltrimethoxysilane, $\gamma$-ureidopropyltriethoxysilane, $\gamma$-glycidoxypropyltrimethoxysilane, $\beta$-(3,4-epoxycyclohexyl) ethyltrimethylsilane, $\gamma$-methacryloyloxypropyltrimethoxysilane, $\gamma$-mercaptopropyltrimethoxysilane, $\gamma$-chloropropyltrimethoxysilane, vinyltri($\beta$-methoxyethoxy)silane, vinyltriethoxysilane, vinyltrichlorosilane, vinyltriacetoxysilane, etc.

(2) long-chain organic carboxylic acids or salts thereof such as oleic acid, coconut oil fatty acid and like aliphatic fatty acid having 12 to 20 carbon atoms; alkali metal (Na, K, $NH_4$ etc) salts thereof; alkali earth metal (calcium, magnesium, etc) salts thereof, etc.

(3) phosphates such as lecithin, GAFAK (a product of Toho Chemical Co., Ltd.), etc.

(4) sorbitan fatty acid esters such as polyoxyethylene sorbitan monooleate, polyoxyethylene sorbitan monostearate, polyoxyethylene sorbitan monolaurate, etc.

(5) organic sulfonates such as sodium dialkylsulfosuccinate, sodium alkylbenzenesulfonate, etc.

Acicular particles of the invention can be treated with the surface-treating agent in a suitable manner. For example, the present particles containing iron carbide are dispersed in a solvent in an amount of up to 10% by weight and a predetermined amount of the surface-treating agent is added to the dispersion with stirring to obtain a layer coated with the agent on the particle surface. In another manner, a solution of the surface-treating agent can be sprayed to form a coated layer on the particle surface. The amount of the surface-treating agent is preferably about 0.01 to about 3% by weight based on the weight of acicular particles containing iron carbide. When the amount is in this range, the effect is highly achieved and the surface-treating agent does not flow out to magnetic recording media, causing no or little disadvantages on the characteristics of the media.

While the present acicular particles containing iron carbide have a high coercive force and magnetic field orientation, it is still preferable to incorporate a sintering-preventing agent in acicular particles to improve a coercive force. Acicular particles containing a sintering-preventing agent can be prepared by coating acicular iron oxyhydroxide with a sintering-preventing agent and contacting the coated iron oxyhydroxide after dehydrated or without dehydration with CO or a mixture thereof with $H_2$.

As sintering-preventing agents, any of compounds can be used which is conventionally employed to prevent sintering for the starting acicular iron oxyhydroxide in the preparation of acicular $\gamma$-$Fe_2O_3$. Examples thereof are silicone compound, beron compound, aluminum compound, aliphatic carboxylic acid or salt thereof, phosphorus compound, titanium compound, etc.

Preferable examples of silicone compounds are water glass, silane coupling agent, etc.

Examples of silane coupling agent are, for example, compounds represented by the general formula $$R.Si.X_{3-n}.Y_n$$

wherein R is vinyl group or alkyl group having 1 to 10 carbon atoms and having at least one atom or group selected from the group consisting of chlorine atom, amino, aminoalkyl, ureido, glycidoxy, epoxycyclohexyl, acryloyloxy, methacryloyloxy, mercapto and vinyl groups; X and Y are respectively chlorine atom, hydroxyl, $C_1 \sim C_{10}$ alkoxyl, $C_2 \sim C_{15}$ alkoxy-substituted alkoxyl, $C_2 \sim C_4$ hydroxyalkoxyl or $C_2 \sim C_{15}$ acyloxy; n is zero or an integer of 1 or 2. R is an alkyl group having a functional substituent. Preferable examples of group R are $\beta$-aminoethyl, $\gamma$-aminopropyl, N-($\beta$-aminoethyl)-$\gamma$-aminopropyl, $\gamma$-uneidopropyl, $\gamma$-glycidoxypropyl, $\beta$-(3,4-epoxycyclohexyl)-ethyl, $\gamma$-acryloyloxypropyl, $\gamma$-methacryloyloxypropyl, $\gamma$-mercaptopropyl, $\beta$-chloroethyl, $\gamma$-chloropropyl, $\gamma$-vinylpropyl, etc. R may be vinyl.

Examples of the silane coupling agents are same as used in the aforementioned surface-treating agent.

Preferred examples of the boron compounds are those containing boron in the molecule in a specific form such as compounds obtained by reacting boric acid and glycerin and like polyvalent alcohol having adjacent hydroxyl groups. Examples of such compounds are polyoxyethylene glycerol borate laurate, polyoxyethylene glycerol borate palmitate, polyoxyethylene glycerol borate stearate, etc.

Preferable examples of aluminum compounds are potassium aluminate, sodium aluminate, etc.

Preferred examples of aliphatic carboxylic acids and salts thereof are oleic acid, coconut oil fatty acid and like aliphatic fatty acid having 12 to 20 carbon atoms; alkali metal (Na, K, etc) salts thereof; alkali earth metal (calcium, magnesium, etc) salts thereof, ammonium salt thereof, etc.

Preferable examples of phosphorus compounds are phosphoric esters, phosphates, etc. Examples of the former are alkylphenol type phosphoric ester, alkylphosphoric ester (GAFAK series, a product of Toho Chemical Co., Ltd.), etc. Examples of the latter are sodium hexametaphosphate, sodium pyrophosphate, sodium metaphosphate, etc.

Preferred examples of titanium compounds are organic titanium compound having a portion bonded to inorganic part and a portion bonded to organic part. Examples of such compounds are diisopropoxy bis-(acetylacetone)titanate, di-n-butoxy bis(triethanolamine)-titanate, dihydroxy bis(lactic amide)titanate, tetraoctylene glycol titanate, etc.

The sintering-preventing agent prevents particles from adhering each other. It can be used singly or in mixture. The amount to be coated on the surface of the starting iron compound varies depending on kinds of the agent, but is preferably about 0.01 to about 0.5% by weight based on the weight of the starting iron compound. With the coated amount in this range, excellent coercive force can be obtained. The coating may be conducted in a usual manner. Generally, acicular particles of the starting iron compound are dispersed in an aqueous solution of the sintering-preventing agent having a suitable concentration, the dispersion, when required, is adjusted in pH and the particles are filtered and dried.

The acicular iron oxyhydroxide thus obtained and having a layer of the sintering-preventing agent on the surface is brought into contact with CO or a mixture thereof with $H_2$. The coated acicular iron oxyhydroxide is subjected to the contact reaction as it is, or as changed into $\alpha$-$Fe_2O_3$ or $\gamma$-$Fe_2O_3$ by heating at about 200° to about 350° C., followed by dehydration, or as changed into $\alpha$-$Fe_2O_3$ having more compact crystal structure by heating the above $\alpha$-$Fe_2O_3$ or $\gamma$-$Fe_2O_3$ at about 350° to 900° C.

The acicular particles thus obtained are acicular particles containing iron carbide which contains sintering-preventing agent. Iron carbide is confirmed by comparing the X-ray diffraction pattern of the product with that of iron carbide containing no sintering-preventing agent. The acicular particles exhibit higher coercive force than those obtained from the starting iron compound containing no sintering-preventing agent. The acicular particles contain similar amount of iron carbide, since there is mere difference in which the starting acicular iron oxyhydroxide is coated with sintering-preventing agent or not. The sintering-preventing agent includes derivativges thereof derived from the contact reaction of CO or a mixture thereof with $H_2$ and acicular iron oxyhydroxide coated with sintering-preventing agent with or without dehydration. The derivatives are presumed to be composed of metal, carbon, hydrogen, oxygen, oxides or halogenides of non-metal other than halogen, or inorganic compounds derived from these.

Since the acicular particles containing iron carbide which contains the sintering-preventing agent have higher coercive force, it is presumed that the agent is coated on the particle surface, which prevents the destruction of acicular form and sintering of particles when heated.

The amount of the sintering-preventing agent after the contact reaction may vary depending on iron carbide content, kinds of the agent used, but is preferably about 0.015 to 0.7% by weight of the acicular particles obtained.

The acicular particles contain a little amount of the sintering-preventing agent but have a higher coercive force. Thus, the particles have a similar shape and composition to those containing no sintering-preventing agent, apart form coercive force and like magnetic characteristics.

The acicular particles of the present invention containing iron carbide are useful as a magnetic material for magnetic recording as is apparent from the foregoing characteristics, etc., while the use thereof is not limited thereto. For example, the acicular particulate material is usable as a catalyst for preparing lower aliphatic hydrocarbons from CO and $H_2$.

The present invention provides a magnetic coating composition comprising the present acicular particles containing iron carbide and a binder containing a film-forming resin as a main component. The magnetic coating composition can be prepared by a known method and is obtained for example by dispersing the above acicular particles in an organic solvent together with a binder. To the composition are added, as required, a dispersing agent, lubricant, abrasive, antistatic agent and like additives.

The organic solvents include ketones such as acetone, methyl ethyl ketone, methyl isobutyl ketone and cyclohexanone; alcohols such as methanol, ethanol, propanol and butanol; esters such as methyl acetate, ethyl acetate, butyl acetate, ethyl lactate and glycol monothyl ether acetate; ethers such as ether, glycol dimethyl ether, glycol monoethyl ether and dioxane; aromatic hydrocarbons such as benzene, toluene and xylene; chlorinated hydrocarbons such as methylene chloride, ethylene chloride, carbon tetrachloride, chloroform, ethylene chlorohydrin and dichlorobenzene; and the like.

Hitherto known thermoplastic resins, thermosetting resins, reaction-type resins, or mixtures thereof, can be used as binders.

Suitable thermoplastic resins are those which have a softening point of about 150° C. or less, an average molecular weight of about 10,000 to 200,000, and a degree of polymerization of about 200 to 2,000, e.g., a vinyl chloride-vinyl acetate copolymer, a vinyl chloride-vinylidene chloride copolymer, a vinyl chloride-acrylonitrile copolymer, an acrylate-acrylonitrile copolymer, an acrylate-vinylidene chloride copolymer, an acrylate-styrene copolymer, a methacrylate-acrylonitrile copolymer, a methacrylate-vinylidene chloride copolymer, a methacrylate-styrene copolymer, a urethane elastomer, a polyvinyl fluoride, a vinylidene chloride-acrylonitrile copolymer, a butadiene-acrylonitrile copolymer, a polyamide resin, polyvinyl butyral, cellulose derivatives such as cellulose acetate butyrate, cellulose diacetate, cellulose triacetate, cellulose propionate, cellulose nitrate, and the like, a styrene-butadiene copolymer, a polyester resin, a chlorovinyl ether-acrylate copolymer, an amino resin, various synthetic rubber based thermoplastic resins and mixtures thereof.

Suitable thermosetting resins or reaction-type resins have a molecular weight of about 200,000 or less as a coating solution, and when heated after coating and drying, the molecular weight becomes infinite due to reactions such as condensation, addition, and the like. Of these resins, preferred resins are those resins which do not soften or melt before the resin thermally decomposes. Representative examples of these resins are a phenol resin, an epoxy resin, a polyurethane hardening type resin, a urea resin, a melamine resin, an alkyd resin, a silicone resin, an acryl based reactive resin, an epoxy-polyamide resin, a mixture of a high molecular weight polyester resin and an isocyanate prepolymer, a mixture of a methacrylic acid copolymer and a diisocyanate prepolymer, a mixture of a polyester-polyol and a polyisocyanate, a urea-formaldehyde resin, a mixture of a low molecular weight glycol, a high molecular weight diol and triphenylmethane triisocyanate, a polyamine resin, and mixtures thereof, etc.

These binders can be used singly or in mixture, and the additives can be added to the binders. The binders are used in an amount of preferably 10 to 400 parts by weight, more preferably 30 to 200 parts by weight per 100 parts by weight of the acicular particles.

The dispersing agents used include aliphatic acids having 12 to 18 carbon atoms ($R^1COOH$) wherein $R^1$ is an alkyl group having 11 to 17 carbon atoms) such as caprylic acid, capric acid, lauric acid, myristic acid, palmitic acid, stearic acid, oleic acid, elaidic acid, linolic acid, linolenic acid and stearolic acid; metal soaps comprising an alkali metal (such as Li, Na and K) or an alkaline earth metal (such as Mg, Ca and Ba) salt of the above aliphatic acids; lecithin, etc. In addition, higher alcohols having 12 or more carbon atoms and sulfuric esters can be used. These dispersing agents are added in an amount of 1 to 20 parts by weight per 100 parts by weight of the binder.

The lubricants used include silicone oil, graphite, molybdenum disulfide, tungsten disulfide, aliphatic esters obtained from monobasic aliphatic acids having 12 to 16 carbon atoms and monohydric alcohols having 3 to 12 carbon atoms, aliphatic esters obtained from monobasic aliphatic acids having 17 or more carbon atoms and monohydric alcohols (the carbon atoms of the monobasic aliphatic acid and the carbon atoms of the monohydric alcohol total 21 to 23), etc. These lubricants are added in an amount of 0.2 to 20 parts by weight per 100 parts by weight of the binder.

The abrasives used include those which are generally used, such as fused alumina, silicon carbide, chromium oxide, corundum, artificial corundum, diamond, artificial diamond, garnet and emery (main components: corundum and magnetite). The average particle diameter of these abrasives is 0.05 to 5 $\mu$m, preferably 0.1 to 2 $\mu$m. These abrasives are added in an amount of 7 to 20 parts by weight per 100 parts by weight of the binder.

Examples of the antistatic agents are natural surfactants such as saponin, nonionic surfactants such as alkylene oxide-base, glycerin-base or glycidol-base surfactant; cationic surfactants such as higher alkylamines, quaternary ammonium salts, pyridine and like heterocyclic compounds, phosphonium or sulfonium compounds; anionic surfactants such as those containing a carboxylic acid, sulfonic acid, phosphoric acid, sulfate group or phosphate group and like acid group; ampholytic surfactants such as amino acids, amino sulfonic acid, sulfate or phosphate of aminoalcohol, etc. These antistatic agent can be used singly or in mixture.

Although the above compounds are used as antistatic agents, the compounds can be used in some cases, to improve the dispersibility, magnetic characteristics, lubricability or coating ability.

The present invention also relates to a magnetic recording medium which is obtained by coating the above magnetic coating composition on a base (support) and drying to form a magnetic layer. The magnetic recording medium of the invention has an excellent magnetic characteristics such as a high coercive force, magnetization and the like, and is less changeable with lapse of time.

The magnetic recording layers are formed by coating the magnetic coating composition on the support.

The thickness of the support used is conventional and is about 5 to 50 $\mu$m, preferably about 10 to 40 $\mu$m. The materials used for the support include polyesters such as polyethylene terephthalate and polyethtylene-2,6-naphthalate, polyolefins such as polypropylene, cellulose derivatives such as cellulose triacetate and cellulose diacetate, polycarbonate, and the like.

For preventing static discharge or preventing transfer printing, the above supports may have a back coat on the surface opposite the surface provided with the magnetic layer.

The supports may be in any shape such as a tape, sheet, card, disc or drum, and various materials can be used depending upon the shape desired and end use contemplated.

The magnetic coating composition can be applied on the support by various conventional methods including air doctor coating, blade coating, air knife coating, squeeze coating, impregnation coating, reverse roll coating, transfer roll coating, gravure coating, kiss coating, cast coating and spray coating. Other coating methods can also be used.

The magnetic layer formed on the support by the above method is dried after, if desired, the coating has been subjected to a treatment for orienting the magnetic powder in the layer. If required, the magnetic layer can be subjected to a surface smoothening treatment, or cut to the desired shape, to thereby form the magnetic recording material of this invention. In the above orienting treatment for the magnetic layer, the orienting magnetic field can be either an AC or DC magnetic field with a field strength of about 500 to 5,000 gauss. The drying temperature can range from about 50° to about 100° C., and the drying time is about 3 to 10 minutes.

The invention will be described below in detail with reference to examples.

In the following examples, characteristics, etc. are determined in the methods described below.

(1) Magnetic characteristics.

Determined in the following method unless otherwise specified.

Coercive force Hc, residual flux density Br and saturation flux density Bm are measured in a magnetic field with a strength of 5 kOe, using a gauss meter equipped with a Hall-effect element and the sample with a packing ratio of 0.2.

(2) Elementary analysis for C, H and N

The sample is subjected to elementary analysis in the conventional method using MT2 CHN CORDER Yanaco, product of Yanagimoto Mfg. Co., Ltd, with passage of oxygen (helium carrier) at 900° C.

(3) Determination of composition the composition of the product is calculated from the chemical formulae of iron oxide and iron carbide determined by X-ray diffractometry, the elementary analysis value of C and the weight gain resulting from the following heat treatment. The calculation is conducted on the basis that $Fe_3O_4$, for example, changes into $Fe_2O_3$ having 1.035 times the weight of the former oxide and that $Fe_5C_2$ changes into $Fe_2O_3$ having 1.317 times the weight of the carbide. The weight gain is determined in the conventional method of heat treatment, i.e. by placing the sample in a platinum crucible, then heating the sample in a muffle furnace at 600° C. for 1 hour in the air and measuring the resulting weight gain after ascertaining the presence of $\alpha$-$Fe_2O_3$ by X-ray diffraction.

Stated more specifically, it is assumed that the proportions of $Fe_5C_2$, $Fe_3O_4$ and elemental carbon are x, y and z wt %, respectively, and that the carbon analysis value and the weight gain are A and B wt %, respectively. The values x, y and z are then given by the following equations.

$$x+y+z=100$$

$$1.317x+1.035y=100+B$$

$$z+0.079x=A$$

FIG. 1 is an electron photomicrograph showing the structure of acicular particles of the invention;

FIGS. 2 to 6 show X-ray diffraction pattern of acicular particles obtained in Examples 1, 4, and 5 to 7.

FIG. 7 shows X-ray diffraction pattern of acicular $Fe_3O_4$ obtained in Reference Example 1.

EXAMPLE 1

Two grams of acicular lepidocrosite particles, 0.7 $\mu$m in average size (long axis) and 10 in average axial ratio, were placed into a porcelain boat, which was then inserted into a tubular furnace. After replacing the air in the furnace by nitrogen, the particles were heated to 340° C. and kept at this temperature for 5 hours while passing a $CO/N_2$ mixture (30/70 in volume ratio) through the furnace at a flow rate of 75 ml/min. The particles were thereafter allowed to cool to room temperature to obtain an acicular black powder.

FIG. 2 shows the X-ray diffraction pattern of the product which matched that of $Fe_5C_2$ Iron Carbide on ASTM X-Ray Powder Data File 20-509. Table 1 shows the peak plane spacings (dÅ) and intensity ratios ($I/I_1$) in FIG. 2 in comparison with those of $Fe_5C_2$ Iron Carbide on the file.

TABLE 1

| Example 1 | | $Fe_5C_2$ | (ASTM) |
|---|---|---|---|
| dÅ | $I/I_1$ | dÅ | $I/I_1$ |
|  |  | 2.653 | 0.10 |
| 2.52 | 0.23 | 2.506 | 0.10 |
| 2.41 | 0.21 | 2.421 | 0.15 |
| 2.28 | 0.36 | 2.287 | 0.20 |
| 2.20 | 0.51 | 2.206 | 0.45 |
|  |  | 2.190 | 0.30 |
| 2.115 | 0.40 | 2.112 | 0.25 |
| 2.078 | 0.84 | 2.080 | 0.70 |
| 2.05 | 1.00 | 2.049 | 1.00 |
| 2.015 | 0.94 | 2.011 | 0.30 |
|  |  | 2.010 | 0.40 |
| 1.92 | 0.28 | 1.950 | 0.45 |
|  |  | 1.910 | <0.05 |
|  |  | 1.821 | 0.20 |
| 1.80 | 0.36 | 1.814 | 0.25 |

No peak was detected for $Fe_3O_4$.

EXAMPLE 2

The powder obtained in Example 1 was tested for magnetic characteristics in a magnetic field with strength of 15 kOe, using a sample-vibrating type magnetometer, Model VSM 3, product of Toei Kogyo Co., Ltd. The results are given below.

Coercive force (Hc): 878 Oe
Remanent magnetization ($\sigma$r): 54.7 emu/g
Saturation magnetization ($\sigma$s): 134.4 emu/g

EXAMPLE 3

The acicular powder obtained in Example 1 was made into a coating composition according to the following formulation.

Acicular powder: 18.25 g
Vinyl chloride-vinyl acetate copolymer: 5.25 g
Dioctyl phthalate : 1.00 g
Lauric acid: 0.2 g
Toluene: 15.0 g
Methyl isobutyl ketone: 15.0 g The coating composition was applied to a polyethylene terephthalate film by a doctor blade (100 $\mu$m), subjected to orientation treatment passed through a repellent magnetic field and dried. The resulting film was checked for magnetic characteristics in directions perpendicular and parallel to the direction of the orientation treatment to determine the magnetic field orientation (degree of orientation). The results are as follows.

Degree of orientation: $Br_{\parallel}/Br_{\perp}$ 1.89

When the direction of measuring magnetic field was parallel to the direction of orientation treatment:
Coercive force: $Hc_{\parallel}$ 930 Oe
Remanent flux density: Br 2250 gauss
Saturation flux density: Bm 3220 gauss
Square ratio: $Br_{\parallel}/Bm_{\perp}$ 0.70

When the direction of measuring magnetic field was perpendicular to the direction of orientation treatment:
Coercive force: $Hc_{\perp}$ 827 Oe
Square ratio: $Br_{\perp}/Bm_{\perp}$ 0.37

The above magnetic films were allowed to place in an atmosphere of 90% humidity and 30° C. for one month to check the corrosion resistance. The decrease of the remanent flux density was up to 1%.

EXAMPLE 4

An acicular black powder was prepared in the same manner as in Example 1 except that the acicular lepidocrosite particles (2 g) were replaced by 2 g of acicular goethite particles having an average particle size of 0.7 μm (long axis) and an average axial ratio of 10.

The X-ray diffraction pattern of the product, which is shown in FIG. 3, corresponded to that of $Fe_5C_2$ Iron Carbide on ASTM X-Ray Powder Data File 20-509. Table 2 shows the plane spacings (dÅ) and intensity ratios $(I/I_1)$ at the peaks A to E in FIG. 3 in comparison with those of $Fe_5C_2$ Iron Carbide on the File.

TABLE 2

| Peak | Example 4 dÅ | Example 4 I/I₁ | Fe₅C₂ (ASTM) dÅ | Fe₅C₂ (ASTM) I/I₁ |
|---|---|---|---|---|
| A | 2.28 | | 2.287 | 0.20 |
| B | 2.20 | 0.79 | 2.206 | 0.45 |
|   |      |      | 2.190 | 0.30 |
| C | 2.08 | 0.95 | 2.080 | 0.70 |
| D | 2.05 | 1.00 | 2.049 | 1.00 |
|   |      |      | 2.011 | 0.30 |
|   |      |      | 2.010 | 0.40 |
| E | 1.92 |      | 1.950 | 0.45 |

No peak was detected for $Fe_3O_4$.

The product was checked for magnetic characteristics with the following results.
Hc 1024 Oe
Br 2225 gauss
Bm 3385 gauss
Br/Bm 0.573

EXAMPLES 5 to 7

Acicular lepidocrosite particles, 0.8 μm in average particle size (long axis) and 10 in average axial ratio, were placed into a muffle furnace and heated at 600° C. for 1 hour to obtain an $\alpha$-$Fe_2O_3$ powder.

A 2-gram portion of the powder was placed into a porcelain boat, which was inserted into a tubular furnace. The powder was then heated at 340° C. for the period of time listed in Table 3 while passing a $CO/N_2$ mixture (30/70 in volume ratio) through the furnace at a flow rate of 75 ml/min, whereby an acicular black powder was obtained. The same procedure as above was repeated under the conditions listed in Table 3.

FIGS. 4 to 6 show the X-ray diffraction patterns of the products. The peaks A, B, C, D and E indicate $Fe_5C_2$, while the peaks A', B', C' and D' indicate, $Fe_3O_4$. The Figures show that the products are a mixture of these compounds.

Table 3 shows the magnetic characteristics and compositions of the products and the results of elementary analysis conducted for C, H and N thereof.

TABLE 3

| Ex. | Time (hr) | Magnetic Characteristics Hc (Oe) | Magnetic Characteristics Br (gauss) | Magnetic Characteristics Bm (gauss) | Br/Bm | Elementary Analysis H (%) | Elementary Analysis C (%) | Elementary Analysis N (%) | Composition (%) Fe₃O₄ | Composition (%) Fe₅C₂ | Composition (%) C |
|---|---|---|---|---|---|---|---|---|---|---|---|
| 5 | 3 | 484 | 1725 | 3660 | 0.471 | 0 | 4.06 | 0 | 74.4 | 23.4 | 2.2 |
| 6 | 5 | 588 | 1755 | 3630 | 0.484 | 0 | 9.08 | 0 | 61.2 | 32.3 | 6.5 |
| 7 | 7 | 576 | 1700 | 3600 | 0.472 | 0 | 10.79 | 0.07 | 53.4 | 38.9 | 7.7 |
| 9 | 5 | 855 | 2025 | 3500 | 0.579 | 0 | 13.97 | 0 | 29.1 | 61.8 | 9.1 |

Table 4 shows the plane spacings (dÅ) and intensity ratios $(I/I_1)$ at the peaks A to E observed in Example 6 in comparison with those of $Fe_5C_2$ Iron Carbide on ASTM X-Ray Powder Data File 20-509.

TABLE 4

| Peak | Example 6 dÅ | Example 6 I/I₁ | Fe₅C₂ (ASTM) dÅ | Fe₅C₂ (ASTM) I/I₁ |
|---|---|---|---|---|
| A | 2.28 | 0.28 | 2.287 | 0.20 |
| B | 2.20 | 0.48 | 2.206 | 0.45 |
|   |      |      | 2.190 | 0.30 |
| C | 2.08 | 1.00 | 2.080 | 0.70 |
| D | 2.05 | 1.00 | 2.049 | 1.00 |
|   |      |      | 2.011 | 0.30 |
|   |      |      | 2.010 | 0.40 |
| E | 1.92 | 0.27 | 1.950 | 0.45 |

EXAMPLE 8

The procedure of Example 5 was repeated except that the reaction was conducted for a fixed period of time of 5 hours at temperatures of 320°, 360° and 400° C. to give acicular magnetic powders which were 450, 540 and 495 Oe, respectively, in coercive force.

EXAMPLE 9

In place of the lepidocrosite used in Example 5, acicular goethite particles, 0.7 μm in average particle size (long axis) and 10 in average axial ratio, were heated in the same manner as in Example 5 to obtain an acicular $\alpha$-$Fe_2O_3$ powder, which was treated with a $CO/N_2$ mixture (30/70 in volume ratio) at 340° C. for 5 hours in the same manner as in Example 5, whereby an acicular black powder was obtained. Table 3 shows the magnetic characteristics, C, H and N elementary analysis values and composition of the product.

EXAMPLE 10

Acicular lepidocrosite particles, 0.8 μm in average particle size (long axis) and 10 average axial ratio, were placed into a muffle furnace and heated at 250° C. for 1 hour, to give $\gamma$-$Fe_2O_3$ powder.

The powder was treated in the same manner as in Example 5 to obtain an acicular powder, which was 541 Oe in Hc.

REFERENCE EXAMPLE 1

Three grams of acicular $\alpha$-Fe$_2$O$_3$ particles, 0.8 $\mu$m in average particle size and 10 in average axial ratio, were placed into a porcelain boat, which was then inserted into a tubular furnace. After replacing the air in the furnace by nitrogen, the particles were heated to 340° C. and contacted, at this temperature for 1 hour, with a CO/N$_2$ mixture (30/70 in volume ratio) which was passed through the furance at a flow rate of 75 ml/min, giving a black powder. The X-ray diffraction pattern of the product, shown in FIG. 7, indicates that it was Fe$_3$O$_4$. When examined for magnetic characteristics, the product was 415 Oe in Hc, 1500 gauss in Br, 3390 gauss in Bm and 0.443 in Br/Bm.

EXAMPLE 11

A two-gram portion of the acicular Fe$_3$O$_4$ particles obtained in Reference Example 1 were placed into a porcelain boat, which was then inserted into a tubular furnace. After replacing the air in the furnace by nitrogen, the particles were heated to 340° C. and contacted, at this temperature for 5 hours, with a CO/N$_2$ mixture (30/70 in volume ratio) which was passed through the furnace at a flow rate of 75 ml/min, to give a black powder. When examined for magnetic characteristics, the powder was 585 Oe in Hc, 1695 gauss in Br, 3560 gauss in Bm and 0.476 in Br/Bm.

The X-ray diffraction pattern of the product had peaks with plane spacings of 2.29Å, 2.21Å, 2.08Å, 2.05Å and 1.92Å.

REFERENCE EXAMPLE 2

Three grams of acicular $\gamma$-FeOOH particles, 0.7 $\mu$m in average particle size and 10 in average axial ratio, were placed into a porcelain boat, which was then inserted into a tubular furnace. After replacing the air in the furnace by nitrogen, the particles were heated to 340° C. and contacted, at this temperature for 30 minutes, with a CO/N$_2$ mixture (30/70 in volume ratio) which was passed through the furnace at a flow rate of 75 ml/min, to give an acicular Fe$_3$O$_4$ powder. The X-ray diffraction pattern of the product was similar to the pattern of FIG. 7. When examined for magnetic characteristics, the product was 385 Oe in Hc, 1450 gauss in Br, 3430 gauss in Bm and 0.423 in Br/Bm.

EXAMPLE 12

A two-gram portion of the acicular Fe$_3$O$_4$ particles obtained in Reference Example 2 were placed into a porcelain boat, which was then inserted into a tubular furnace. After replacing the air in the furnace by nitrogen, the particles were heated to 340° C. and contacted, at this temperature for 2 hours, with a CO/N$_2$ mixture (30/70 in volume ratio) which was passed through the furnace at a flow rate of 75 ml/min, to give a black powder. When examined for magnetic characteristics, the powder was 925 Oe in Hc, 2025 gauss in Br, 3580 gauss in Bm and 0.566 in Br/Bm. The composition of the product was 39.1% Fe$_3$O$_4$, 56.3% Fe$_5$C$_2$ and 4.6% C.

EXAMPLE 13

The process of Example 5 was repeated except that the CO/N$_2$ mixture was replaced by a mixture of H$_2$/CO/N$_2$ (10/50/40 in volume ratio), giving an acicular black powder.

The magnetic characteristics of the powder were determined with the following results.
  Coercive force Hc 536 Oe
  Remanant flux density Br 1650 gauss
  Saturation flux density Bm 3415 gauss
  Square ratio Br/Bm 0.483

The X-ray diffraction pattern of the product had peaks with plane spacings of 2.29Å, 2.21Å, 2.08Å, 2.05Å and 1.92Å.

REFERENCE EXAMPLE 3

To a one-liter of aqueous solution of 60 g of FeCl$_3$ was added 120 g of urea. The mixture was heated at 90° C. for 8 hours with stirring while refluxing by use of a condenser cooled with water. The product was filtered, washed with water and dried to obtain acicular $\beta$-FeOOH particles which have average size (long axis) of 0.3 $\mu$m and average axial ratio of 6.

The above acicular $\beta$-FeOOH(4 g) was added to 300 ml of an aqueous solution of 6N-NaOH. The mixture was heated at 95° C. for 5 hours with stirring while refluxing by use of a condenser cooled with water. The mixture was filtered, washed with water and dried to obtain acicular $\beta$-FeOOH particles which were free from chlorides.

EXAMPLE 14

A two-gram portion of the acicular $\beta$-FeOOH particles which were free from chlorides and obtained in Reference Example 3 were placed into a porcelain boat, which was then inserted into a tubular furnace. The particles were contacted at 340° C. for 5 hours, with CO(100%) which was passed through the furnace at a flow rate of 200 ml/min, to give a black powder. When examined for magnetic characteristics, the powder was 535 Oe in Hc and 84.3 emu/g in saturation magnitization($\sigma$s).

The X-ray diffraction pattern of the product showed Fe$_5$C$_2$.

EXAMPLE 15

Two grams of acicular goethite particles which were 8.0 in pH on the surface, 0.6 $\mu$m in average size (long axis) and 8 in average axial ratio, were placed into a porcelain boat, which was then inserted into a tubular furnace. After replacing the air in the furnace by nitrogen, the particles were heated to 250° C. and treated at this temperature for 5 hours while passing CO through the furnace at a flow rate of 200 ml/min. The particles were thereafter allowed to cool to room temperature to obtain an acicular black powder which was 940 Oe in Hc.

The X-ray diffraction pattern of the powder had peaks with plane spacings of 2.29, 2.21, 2.08, 2.05 and 1.92Å.

EXAMPLES 16 and 17

The procedure of Example 15 was repeated except that the reaction was conducted at temperatures of 280° and 300° C. to give acicular magnetic powders containing iron carbide which were 988 and 945 Oe, respectively, in coercive force.

EXAMPLE 18

Two grams of acicular lepidocrosite particles which were 6.5 in pH on the surface, 0.7 $\mu$m in average size (long axis) and 10 in average axial ratio, were placed into a porcelain boat, which was then inserted into a tubular furnace. After replacing the air in the furnace by nitrogen, the particles were heated to 240° C. and treated at this temperature for 5 hours while passing a $CO/N_2$ mixture (30/70 in volume ratio) through the furnace at a flow rate of 75 ml/min. The particles were thereafter allowed to cool to room temperature to obtain an acicular black powder.

The X-ray diffraction pattern of the product matched that of $Fe_5C_2$ Iron Carbide on ASTM X-Ray Powder Data File 20-509. The acicular powder contained iron carbide of 81.2% by weight in term of $Fe_5C_2$ and were 810 in Hc.

EXAMPLE 19

An acicular powder was prepared in the same manner as in Example 18 with the exception of using acicular goethite particles which were 8.0 in pH on the surface, 0.6 μm in average size (long axis) and 8 in average axial ratio. The acicular powder contained iron carbide of 70.3% by weight and were 798 in Hc.

EXAMPLE 20

In 2 liter of water was dispersed 50 g of lepidocrosite particles which were prepared in an acidic side and were 3.4 in pH on the surface, 0.8 μm in average size (long axis) and 10 in average axial ratio. Thereto was added 6N aqueous solution of NaOH and the mixture was stirred for one day. Then, the mixture was filtered, washed with water and dried to obtain lepidocrosite particles, 5.0 in pH on the surface.

An acicular powder was prepared in the same manner as in Example 18 with the exception of using the above lepidocrosite particles and CO. The acicular powder contained iron carbide of 80.8% by weight and were 808 in Hc.

EXAMPLE 21

An acicular powder was prepared in the same manner as in Example 20 with the exception of using lepidocrosite particles, 10.6 in pH on the surface which were prepared in the similar method as in Example 20. The acicular powder contained iron carbide of 82.4% by weight and were 823 in Hc.

EXAMPLE 22

Four kinds of goethite particles, each 5.0, 8.8, 9.5 and 10.0 in pH on the surface, were prepared in the same manner as in Example 20 by treating acicular goethite particles which were 3.0 in pH on the surface, 0.8 μm in average size (long axis) and 8 in average axial ratio.

The following acicular powders were obtained in the same manner as in Example 20 with use of each of the goethite particles.

| pH | Iron carbide (wt %) | Hc |
|---|---|---|
| 5.0 | 62.25 | 885 |
| 8.8 | 70.65 | 895 |
| 9.5 | 71.54 | 900 |
| 10.0 | 72.91 | 915 |

EXAMPLE 23

Into a muffle furnace were placed lepidocrosite particles, 10.6 in pH on the surface which were prepared in the similar method as in Example 20. The particles were heated at 600° C. for one hour to obtain an acicular $\alpha$-$Fe_2O_3$ powder.

Two grams of the above powder were placed into a porcelain boat, which was then inserted into a tubular furnace. The particles were heated at 340° C. for 3 hours while passing a $CO/N_2$ mixture (30/70 in volume ratio) through the furnace at a flow rate of 75 ml/min. The particles were thereafter allowed to cool to room temperature to obtain an acicular black powder. The acicular powder contained iron carbide of 54.08% by weight and was 802 in Hc.

EXAMPLE 24

Into a muffle furnace were placed lepidocrosite particles, 10.6 in pH on the surface which were prepared in the similar method as in Example 20. The particles were heated at 250° C. for one hour to obtain an acicular $\gamma$-$Fe_2O_3$ powder.

Two grams of the above powder were placed into a porcelain boat, which was then inserted into a tubular furnace. The particles were heated at 340° C. for 5 hours while passing a $CO/N_2$ mixture (30/70 in volume ratio) through the furnace at a flow rate of 75 ml/min. The particles were thereafter allowed to cool to room temperature to obtain an acicular black powder. The acicular powder were 820 in Hc.

EXAMPLE 25

In 2 liter of water was dispersed 50 g of goethite particles which were 3.0 in pH on the surface, 0.7 μm in average size (long axis) and 10 in average axial ratio. Thereto was added 6N aqueous solution of NaOH and the mixture was stirred for one day. Then, the mixture was filtered, washed with water and dried to obtain goethite particles, 9.5 in pH on the surface.

Into a muffle furnace were placed the above goethite particles. The particles were heated at 600° C. for one hour to obtain an acicular $\alpha$-$Fe_2O_3$ powder.

The powder was contacted with $CO/N_2$ in the same manner as in Example 24 and was allowed to cool to prepare an acicular black powder. The acicular powder contained iron carbide of 61.8% by weight and was 855 in Hc.

EXAMPLE 26

In 100 g of aqueous solution of 0.5 wt % of $\gamma$-glycidoxypropyltrimethoxysilane was dispersed 10g of acicular lepidocrosite particles, 0.8 μm in average size (long axis) and 8 in average axial ratio. After one hour, the dispersion was filtered and dried. The obtained powder was placed into a muffle furnace and heated at 600° C. for 1 hour to prepare an $\gamma$-$Fe_2O_3$ powder.

A 2-gram portion of the powder was placed into a porcelain boat, which was then inserted into a tubular furnace. The powder was treated at 340° C. for 3 hours while passing a $CO/N_2$ mixture (30/70 in volume ratio) through the furnace at a flow rate of 75 ml/min. An acicular black powder was obtained which were 850 Oe in coercive force.

EXAMPLE 27

In 97 g of water was dispersed 3 g of acicular goethite particles, 0.7 μm in average size (long axis) and 10 in average axial ratio. Thereto was added a small amount of an alkali solution (NaOH 20% solution) to adjust a pH more than 13. To the mixture was added 0.5 g of water glass No. 3 ($Na_2O.3SiO_2$) with stirring. To the dispersion was added 1N-HCl solution to adjust a pH at 5. After one hour, the dispersion was filtered and dried. The obtained powder was placed into a muffle furnace and heated at 600° C. for 1 hour to prepare an $\alpha$-Fe$_2$O$_3$ powder.

An acicular powder was prepared in the same manner as in Example 26 with the exception of using the powder. The acicular powder obtained had coercive force of 890 Oe.

EXAMPLE 28

In 100 g of water was dispersed 3 g of goethite particles of Example 27. Thereto was added 0.0368 g of potassium aluminate (K$_2$Al$_2$O$_3$.3H$_2$O) with stirring. The dispersion was adjusted in pH of 7. An acicular powder was prepared in the same manner as in Example 27. The acicular powder obtained had coercive force of 855 Oe.

EXAMPLE 29

In 200 g of water was dispersed 7 g of goethite particles of Example 27. Thereto was added an alkali solution to adjust a pH more than 12. To the mixture was added 0.05g of sodium hexametaphosphate with stirring. To the dispersion was added 1N-HCl solution to adjust a pH at 5. An acicular powder was prepared in the same manner as in Example 27. The acicular powder obtained had coercive force of 875 Oe.

EXAMPLE 30

In 1000 g of aqueous solution of 1 wt % of di-n-butoxybis (triethanolamine) titanate was dispersed 10 g of goethite particles of Example 27. An acicular powder was prepared in the same manner as in Example 27. The acicular powder obtained had coercive force of 871 Oe.

EXAMPLE 31

In 1000 g of aqueous solution of 0.05 wt % of polyoxyethylene glycerol was dispersed 10 g of goethite particles of Example 27. An acicular powder was prepared in the same manner as in Example 27. The acicular powder obtained had coercive force of 874 Oe.

EXAMPLE 32

In 200 g of water was dispersed 5 g of goethite particles of Example 27. Thereto was added 1 g of coconut oil fatty acid and the mixture was stirred for 1 hour, filtered and dried. The obtained particles (2 g) was placed into a porcelain boat, which was inserted into a tubular furnace. The particles were then treated at 340° C. for 3 hours while passing CO (100%) through the furnace at a flow rate of 200 cc/min to obtain an acicular powder having coercive force of 925 Oe.

EXAMPLES 33 to 38

In 200 g of acetone was suspended 20 g of the acicular particles of Example 1. Thereto was added 0.5 g of each surface-treating agent listed in Table 5. The mixture was stirred for 1 hour, filtered and dried at room temperature under a reduced pressure to obtain acicular particles which was surface-treated.

A magnetic coating composition and magnetic film was prepared in the same manner as in Example 3 with use of each of the above surface-treated acicular particles.

The obtained film was checked for magnetic characteristics in coercive force (Hc), remanent flux density (Br) and square ratio.

In the Table,
A: $\gamma$-glycidoxypropyltrimethoxysilane
B: oleic acid
C: GAFAK RA-600
D: polyoxyethylene sorbitan monooleate
E: sodium dioctylsulfosuccinate
F: sodium oleate

TABLE 5

|    | Surface-treating agent | Hc (Oe) | Br (gauss) | Square ratio |
|----|----|-----|------|------|
| 33 | A  | 985 | 2415 | 0.75 |
| 34 | B  | 963 | 2350 | 0.73 |
| 35 | C  | 978 | 2380 | 0.74 |
| 36 | D  | 947 | 2320 | 0.72 |
| 37 | E  | 942 | 2310 | 0.72 |
| 38 | F  | 954 | 2330 | 0.72 |

In another aspect, the present invention relates to a process for producing acicular particles containing an iron carbide.

The invention relates to a process for producing acicular particles containing an iron carbide.

The applicant has filed patent applications based on the finding that acicular particles containing iron carbide are produced by contacting acicular iron oxyhydroxide or acicular iron oxide with CO or a mixture of CO and H$_2$ at 250° to 400° C., and that these particles are chemically stable, have high coercive force and are useful for a magnetic material of the magnetic recording medium (Japanese patent application Nos. 171765/1983, 217530/1983, 236753/1983 and 10400/1984). Although $\gamma$-Fe$_2$O$_3$ is easily available among the starting iron compounds, particles obtained therefrom are low in content of an iron carbide and have a disadvantage of being inferior in the magnetic characteristics.

An object of the invention is to provide a process for producing a particle having a high content of an iron carbide and an excellent magnetic characteristics from an easily available $\gamma$-Fe$_2$O$_3$.

The above and other objects of the invention will become apparent from the following description.

The invention provide a process for producing acicular particles containing an iron carbide which comprises, subjecting $\gamma$-Fe$_2$O$_3$ to be treated with an alkaline compound or to be coated with a cobalt compound and contacting the above $\gamma$-Fe$_2$O$_3$ with CO or a mixture of CO and H$_2$.

$\gamma$-Fe$_2$O$_3$ is, for example, any of one prepared by heating $\gamma$-FeOOH, $\beta$-FeOOH or $\gamma$-FeOOH at about 200° to about 350° C., followed by dehydration, $\gamma$-Fe$_2$O$_3$ prepared by heating $\alpha$-, $\beta$- or $\gamma$-FeOOH at about 300° to about 600° C. to produce a $\alpha$-Fe$_2$O$_3$, reducing the $\alpha$-Fe$_2$O$_3$ to Fe$_3$O$_4$ and oxidizing the Fe$_3$O$_4$ at about 300° to about 400° C. to compact the crystals, and others. $\gamma$-Fe$_2$O$_3$ can be one prepared by dehydrating $\alpha$-, $\beta$- or $\gamma$-FeOOH having a surface pH of at least 5.

The starting $\gamma$-Fe$_2$O$_3$ can be those usually at least 3, preferably 3 to 20, in average axial ratio and having an average particle size (long axis) of usually up to 5 $\mu$m, preferably 0.1 to 2 $\mu$m, most preferably 0.1 to 1.0 $\mu$m. As will be described later, the acicular particles produced are slightly smaller than, but almost unchanged from, the starting material in average axial ratio and in average particle size, so that the acicular particles of the invention in general preferably have such sizes as already stated.

The starting $\gamma$-Fe$_2$O$_3$ to be used for the process for producing acicular particles according to the invention may have added thereto a small amount or small amounts of a compound, such as oxide or carbonate of copper, magnesium, manganese or nickel, silicon oxide, potassium salt, sodium salt, etc., insofar as the starting material chiefly comprises $\gamma$-$Fe_2O_3$.

In the invention, $\gamma$-$Fe_2O_3$ is used as treated with an alkali compound or as coated with a cobalt compound.

The alkali treatment can be conducted in a conventional manner and, for example, by contacting $\gamma$-$Fe_2O_3$ with an aqueous solution of sodium hydroxide, potassium hydroxide, ammonium hydroxide and like alkaline compound (e.g., with an aqueous solution having a pH of at least 8, preferably at least 10), stirring for 30 minutes to 1 hour when required, filtering and drying the mixture.

The cobalt-coating can also be conducted according to a known method and, for example, by dispersing $\gamma Fe_2O_3$ in an aqueous solution of a cobalt salt (e.g., dilute solution of 0.1 to 10% by weight) with stirring at room temperature or with heating, render the dispersion to alkaline with addition of an aqueous solution of an alkaline compound, stirring for 30 minutes to 1 hour when required, filtering and drying the dispersion.

The starting iron compound can be used as coated with a sintering-preventing agent as disclosed in Japanese patent application No. 250,163/1983. Examples of useful agents are silicone compound, boron compound, aluminum compound, aliphatic carboxylic acid or salt thereof, phosphorus compound, titanium compound, etc.

In the process of the invention, CO or a mixture of CO and $H_2$ can be used as it is or as diluted. Examples of diluents are $N_2$, argon, helium, etc. When the mixture of CO and $H_2$ is used, the mixing ratio of CO/$H_2$ is suitably selected but is preferably 1/0.05 to 1/5 by volume. The dilution ratio is suitably selected but is preferably about 1.1 to about 10 times (by volume). The contact temperature, contact time, gas flow rate and other conditions depend, for example, on the production history, average axial ratio, average particle size and specific surface area of $\gamma$-$Fe_2O_3$. The preferred contact temperature is about 250° to about 400° C., more preferably about 300° to about 380° C. The preferred contact time is about 1 to about 12 hours. The preferred gas flow rate (excluding diluent) is about 1 to about 1000 ml S.T.P./min, more preferably about 5 to about 500 ml S.T.P./min, per gram of the starting $\gamma$-$Fe_2O_3$. The contact pressure inclusive of that of the diluent is usually 1 to 2 atom. although not limitative particularly.

The particulate material obtained by the present process are in the form of generally uniform acicular particles when observed under an electron microscope. The particles are present as primary particles and have the same acicular particulate form as the starting particles of acicular iron oxyhydroxide or acicular iron oxide. The acicular particles obtained by the process are found to contain carbon by elementary analysis and to contain an iron carbide by its X-ray diffraction pattern, which exhibits plane spacings at 2.28Å, 2.20Å, 2.08Å, 2.05Å and 1.92Å. Such pattern corresponds to $Fe_5C_2$. The iron carbide component of the present material chiefly comprises $Fe_5C_2$, with $Fe_2C$, $Fe_{20}C_9$ ($Fe_{2.2}C$), $Fe_3C$, etc. present conjointly therewith in some cases. It is suitable to represent the iron carbide as $Fe_xC$ ($2 \leq x < 3$).

In the event of incomplete carbonization, the acicular particles obtained by the present process further contain an iron oxide component which is chiefly $Fe_3O_4$. With respect to iron oxides, FeO, $Fe_3O_4$ and $\gamma$-$Fe_2O_3$ are generally related to one another in structure. The oxygen atoms in these three oxides are packed in a three-dimensional structure to the highest possible density, and the number of oxygen atoms in $Fe_3O_4$ actually present varies in an overall range covering the numbers of oxygen atoms in these oxides, so that it is suitable to represent the iron oxide in the acicular particles by $FeO_y$ ($1 < y \leq 1.5$).

While the acicular particles prepared by the present process contain iron oxide in addition to the iron carbide component in most cases, the elementary analysis values of C, H and N indicate that the amount of carbon is usually excess of that calculated from the chemical formula of the iron carbide identified by the X-ray diffraction pattern. It is not clear whether the excess of carbon is present as combined with iron or as free carbon. In this sense, it is probable that the acicular particles obtained by the present process contain elemental carbon. The particles obtained by the present process then include acicular particles at least 3 in average axial ratio with respect to their shape as primary particles and composed substantially of iron carbide alone or iron carbide and iron oxide and/or elemental carbon.

The iron carbide and iron oxide contents of the acicular particles obtained by the present process can be determined from the chemical formulae $Fe_5C_2$ and $Fe_3O_4$, which are confirmed as the main iron carbide and iron oxide components by X-ray diffraction analysis, the result of elementary analysis and the weight gain on ignition. The iron carbide content is preferably at least 20 wt %, more preferably at least 50 wt %. The iron oxide content is preferably up to 70 wt %, more preferably up to 40 wt %.

In the invention, the iron carbide contains $Fe_5C_2$ as a main component and contains preferably about 80 to 100% by weight of $Fe_5C_2$.

The acicular particles obtained by the present process are slightly smaller than but almost the same as the starting particles, namely $\gamma$-$Fe_2O_3$, in average axial ratio and average particle size. Accordingly the acicular particles prepared by the present process have an average axial ratio usually of at least 3, preferably 3 to 20, and an average particle size (long axis) usually of up to 5 $\mu$m, preferably 0.1 to 2 $\mu$m, most preferably 0.1 to 1.0 $\mu$m.

The acicular particles of the present invention containing iron carbide are useful as a magnetic material for magnetic recording as is apparent from the foregoing characteristics, etc., while the use thereof is not limited thereto. For example, the acicular particulate material is usable as a catalyst for preparing lower aliphatic hydrocarbons from CO and $H_2$.

In the present invention, it is possible to produce a particle having a high content of an iron carbide and an excellent magnetic characteristics from an easily available $\gamma$-$Fe_2O_3$.

The invention will be described below in detail with reference to examples.

In the following examples, characteristics, etc. are determined in the methods described below.

(1) Magnetic characteristics.

Determined in the following method unless otherwise specified.

Coercive force Hc, saturation magnetization ($\sigma s$, e.m.u.) and remanent magnetization ($\sigma r$, e.m.u.) are measured in a magnetic field with a strength of 5 kOe, using a gauss meter equipped with a Hall-effect element and the sample with a packing ratio of 0.2.

(2) Elementary analysis for C, H and N

The sample is subjected to elementary analysis in the conventional method using MT2 CHN CORDER Yanaco, product of Yanagimoto Mfg. Co., Ltd, with passage of oxygen (helium carrier) at 900° C.

(3) Determination of composition

The composition of the product is calculated from the chemical formulae of iron oxide and iron carbide determined by X-ray diffractiometry, the elementary analysis value of C and the weight gain resulting from the following heat treatment. The calculation is conducted on the basis that $Fe_3O_4$, for example, changes into $Fe_2O_3$ having 1.035 times the weight of the former oxide and that $Fe_5C_2$ changes into $Fe_2O_3$ having 1.317 times the weight of the carbide. The weight gain is determined in the conventional method of heat treatment, i.e. by placing the sample in a platinum crucible, then heating the sample in a muffle furnace at 600° C. for 1 hour in the air and measuring the resulting weight gain after ascertaining the presence of $\alpha$-$Fe_2O_3$ by X-ray diffraction.

Stated more specifically, it is assumed that the proportions of $Fe_5C_2$, $Fe_3O_4$ and elemental carbon are x, y and z wt %, respectively, and that the carbon analysis value and the weight gain are A and B wt %, respectively. The values x, y and z are then given by the following equations.

$$x+y+z=100$$

$$1.317x+1.035y=100+B$$

$$z+0.079x=A$$

REFERENCE EXAMPLE 4

$\alpha$-FeOOH (3 g) was dehydrated at 600° C. for 1 hour to prepare $\alpha$-$FE_2O_3$. The $\alpha$-$Fe_2O_3$ was reduced with $H_2$ at 400° C. for 1 hour and then oxidized in the air at 350° C. for 1 hour to obtain $\gamma$-$Fe_2O_3$. The $\gamma$-$Fe_2O_3$ was dispersed in 100 ml of 2% aqueous solution of sodium hydroxide with stirring at room temperature for 1 hour. The dispersion was filtered and dried to obtain an alkali treated $\gamma$-$Fe_2O_3$.

REFERENCE EXAMPLE 5

$\alpha$-FeOOH (3 g) was dispersed in 200 ml of an aqueous solution of sodium hydroxide with stirring at room temperature for 1 hour. The dispersion was filtered and dried. The resulting $\alpha$-FeOOH was placed into a muffle furnace and heated at 300° C. for 1 hour to give $\gamma$-$Fe_2O_3$.

The $\gamma$-$Fe_2O_3$ was dispersed in 100 ml of 2% aqueous solution of cobalt sulfate with stirring. Thereto added an aqueous solution of NaOH to adjust a pH to 10 and the mixture was stirred at 80° C. for 30 minutes. The dispersion was filtered and dried to obtain $\gamma$-$Fe_2O_3$ coated with cobalt.

REFERENCE EXAMPLE 6

$\alpha$-FeOOH (3 g) was dehydrated at 600° C. for 1 hour to prepare $\alpha$-$Fe_2O_3$. The $\alpha$-$Fe_2O_3$ wad reduced with $H_2$ at 400° C. for 1 hour and then oxidized in air at 350° C. for 1 hour to obtain $\gamma$-$Fe_2O_3$. $\gamma$-$Fe_2O_3$ coated with cobalt was prepared in the same manner as in Reference Example 5 with use of the above $\gamma$-$Fe_2O_3$.

EXAMPLES 39 to 43

Two grams of acicular $\gamma$-$Fe_2O_3$ particles treated with alkali or coated with cobalt, having an average particle size (long axis) and an average axial ratio listed in Table 6, were placed into a porcelain boat, which was then inserted into a tubular furnace. After replacing the air in the furnace by nitrogen, the particles were heated to a prescribed temperature and kept at the temperature for a prescribed time while passing a gas at a flow rate, each listed in Table 6. The particles were thereafter allowed to cool to room temperature to obtain an acicular black powder.

The X-ray diffraction pattern of the product matched that of $Fe_2C_2$ Iron Carbide on ASTM X-Ray Powder Data File 20-509. Table 7 shows the magnetic characteristics and compositions of the products.

TABLE 6

| | Starting material | | | Gas contacted | | Contact temp (°C.) | Contact time (hr) |
|---|---|---|---|---|---|---|---|
| Ex. | kind | particle size($\mu$m) | axial ratio | kind | flow rate (ml/min) | | |
| 1 | $\gamma$-$Fe_2O_3$ of Ref. Ex. 1 | 0.3 | 10 | CO | 500 | 350 | 3.0 |
| 2 | $\gamma$-$Fe_2O_3$ of Ref. Ex. 2 | 0.5 | 10 | CO | 500 | 350 | 5.0 |
| 3 | $\gamma$-$Fe_2O_3$ of Ref. Ex. 3 | 0.5 | 10 | CO | 500 | 360 | 3.0 |
| 4 | $\gamma$-$Fe_2O_3$ of Ref. Ex. 1 | 0.3 | 10 | $CO/H_2$ (1/3) | 500 | 350 | 2 |
| 5 | $\gamma$-$Fe_2O_3$ of Ref. Ex. 3 | 0.5 | 10 | $CO/H_2$ (1/3) | 500 | 360 | 2 |

TABLE 7

| | Product | | | | | | Composition (wt %) | | |
|---|---|---|---|---|---|---|---|---|---|
| Ex. | particle size($\mu$m) | axial ratio | Hc | $\sigma_s$ | $\sigma_r$ | $\sigma_r/\sigma_s$ | $Fe_3O_4$ | $Fe_5C_2$ | C |
| 1 | 0.3 | 9 | 835 | 77.3 | 45.6 | 0.59 | 10 | 78 | 12 |
| 2 | 0.5 | 9 | 876 | 79.1 | 46.7 | 0.59 | 8 | 82 | 10 |
| 3 | 0.5 | 8 | 792 | 73.5 | 43.3 | 0.59 | 9 | 76 | 15 |
| 4 | 0.3 | 9 | 910 | 79.3 | 47.7 | 0.60 | 2 | 85 | 13 |
| 5 | 0.5 | 8 | 832 | 80.1 | 43.8 | 0.55 | 2 | 87 | 11 |

In yet another embodiment, the invention relates to particles containing an iron carbide, process and use thereof.

The invention relates to particles containing an iron carbide, process and use thereof.

At present, acicular γ-iron oxide is widely used as a magnetic recording material. However, γ-iron oxide having an average axial ratio of at least 1.0 and less than 3.0 is low in the magnetic characteristics such as coercive force, etc. and is not used presently as the magnetic recording material. Despite the above, the iron oxide or starting material thereof such as other iron oxides or iron oxyhydroxides are easily prepared and particles obtained therefrom are expected to have a high compact density when coated.

Further, iron carbide in the form of spherical particles is known to be a magnetic material (U.S. Pat. No. 3,572,993). This iron carbide is, however, prepared by heating iron carbonyl in CO or a mixture of CO and $H_2$. The method is dangerous, complicated and is conducted with an extreme difficulty. Moreover, particles produced have a very small average particle size of 0.005 to 0.1 μm, easily agglomerate and are hardly dispersible. Thus, the particles are difficult to be handled and are not manufactured presently.

An object of the invention is to provide a particle having a relatively high coercive force and easily handled due to a relatively large average particle size obtained from an easily available starting iron compound, and a magnetic material containing the above particle.

The above and other objects of the invention will become apparent from the following description.

The invention provides particles containing an iron carbide having an average axial ratio of at least 1.0 and less than 3.0, and an average particle size of more than 0.1 μm and up to 5 μm.

The present particles can be produced by (a) contacting or not contacting acicular oxyhydroxide or acicular iron oxide with a reducing agent containing no carbon atom, the iron compound having an average axial ratio of at least 1.0 and less than 3.0, and an average particle size of more than 0.1 μm and up to 5 μm and, (b) contacting the iron compound of the above (a) with a reducing-and-carbonizing agent containing carbon atom or a mixture thereof with a reducing agent containing no carbon atom.

Examples of preferred iron oxyhydroxides are α-FeOOH (goethite), β-FeOOH (akaganite) and γ-FeOOH (lepidocrosite). Examples of preferred iron oxides are $\alpha$-$Fe_2O_3$ (hematite), $\gamma$-$Fe_2O_3$ (maghemite) and $Fe_3O_4$ (magnetite).

$\alpha$-$Fe_2O_3$ or $\gamma$-$Fe_2O_3$ is, for example, any of one prepared by heating α-FeOOH, β-FeOOH or γ-FeOHH at about 200° to about 350° C., followed by dehydration, $\alpha$-$Fe_2O_3$ or $\gamma$-$Fe_2O_3$ prepared by heating the resulting product further at about 350° to about 900° C. to compact the crystals, and others. β-FeOOH is preferably treated with an aqueous solution of alkaline compound (Japanese patent application No. 10400/1984).

The above-mentioned $Fe_3O_4$ can be prepared by contacting an iron oxide other than $Fe_3O_4$ or iron oxyhydroxide with a reducing-and-carbonizing agent containing carbon atom or a reducing agent containing no carbon atom, or a mixture thereof. although the $Fe_3O_4$ is not limited to one prepared in those methods. When a reducing-and-carbonizing agent containing carbon atom or a mixture thereof with a reducing agent containing no carbon atom, is contacted with an iron oxyhydroxide or iron oxide other than $Fe_3O_4$ to prepare $Fe_3O_4$, the same contact conditions as those in the process of the invention can also be employed except for the time condition. In this case, the $Fe_3O_4$ formed can be subsequently held in contact with the gas under the same conditions as in the preceding reaction without any interruption to obtain the desired particulate material of the invention.

The starting iron oxyhydroxides or iron oxides can be those at least 1.0 and less than 3.0, in average axial ratio and having an average particle size (long axis) of more than 0.1 μm and up to 5 μm. As will be described later, the particles produced are slightly smaller than, but almost unchanged from, the starting material in average axial ratio and in average particle size, so that the particles of the invention in general preferably have such sizes as already stated.

The starting material to be used for the process for producing particles according to the invention may have added thereto a small amount or small amounts of a compound, such as oxide or carbonate of copper, magnesium, manganese or nickel, silicon oxide, potassium salt, sodium salt, etc., insofar as the starting material chiefly comprises an iron oxyhydroxide or iron oxide.

The starting iron oxyhydroxide preferably has a pH of at least 5 on the surface thereof as disclosed in Japanese patent application No. 217,530/1983.In this case are produced particles having a higher coercive force. The starting iron oxyhydroxide having a pH of less than 5 can be used after it is increased to at least 5 in pH by contact with an aqueous solution of an alkali compound (e.g., sodium hydroxide, potassium hydroxide, ammonium hydroxide). Further, alkali-treated iron oxide can also be used. The starting material can be treated with an alkaline compound by contacting the material with an aqueous solution of sodium hydroxide, potassium hydroxide, ammonium hydroxide and like alkaline compound (eg, with an aqueous solution having a pH of at least 8, preferably at least 10), stirring for 30 minutes to 1 hour when required, filtering and drying the mixture.

Iron oxyhydroxide or iron oxide can be coated with a cobalt compound, for example, by dispersing the iron compound in an aqueous solution of a cobalt salt (eg, dilute solution of 0.1 to 10% by weight) with stirring at room temperature or with heating, render the dispersion to alkaline with addition of an aqueous solution of an alkaline compound, stirring for 30 minutes to 1 hour when required, filtering and drying the dispersion.

The starting iron compound can be used as coated with a sintering-preventing agent as disclosed in Japanese patent application No. 250,163/1983. Examples of useful agents are silicone compounds, boron compound, aluminum compound, aliphatic carboxylic acid or salt thereof, phosphorus compound, titanium compound, etc.

In the invention, typical examples of the reducing agent containing no carbon atom are $H_2$, $NH_2NH_2$, etc.

As the reducing-and-carbonizing agent, at least one of the following compounds can be used.

①CO
②aliphatic, linear or cyclic, saturated or unsaturated hydrocarbons such as methane, propane, butane, cyclohexane, methylcyclohexane, acetylene, ethylene, propylene, butadiene, isoprene, town gas, etc.
③aromatic hydrocarbons such as benzene, toluene, xylene, alkylated or alkenylated derivatives thereof having a boiling point up to 150° C.
④aliphatic alcohols such as methanol, ethanol, propanol, cyclohexanol, etc.

⑤esters such as methyl formate, ethyl acetate and like ester having a boiling point up to 150° C.
⑥ethers such as lower alkyl ether, vinyl ether and like ether having a boiling point up to 150° C.
⑦aldehydes such as formaldehyde, acetaldehyde and like aldehyde having a boiling point up to 150° C.
⑧ketones such as acetone, methyl ethyl ketone, methyl isobutyl ketone and like ketone having a boiling point up to 150° C.

Particularly preferable reducing-and-carbonizing agent containing carbon atom are CO, $CH_3OH$, $HCOOCH_3$, saturated or unsaturated aliphatic hydrocarbons having 1 to 5 carbon atoms.

In the process (a) of the invention, the reducing agent containing no carbon atom can be used as it is or as diluted. Examples of diluents are $N_2$, argon, helium, etc. The dilution ratio is suitably selected but is preferably about 1.1 to about 10 times (by volume). The contact temperature, contact time, gas flow rate and other conditions depend, for example, on the production history, average axial ratio, average particle size and specific surface area of the iron oxyhydroxide or iron oxide. The preferred contact temperature is about 200° to about 700° C., preferably about 300° to about 400° C. The preferred contact time is about 0.5 to about 6 hours. The preferred gas flow rate (excluding diluent) is about 1 to about 1000 ml S.T.P./min, more preferably about 5 to about 500 ml S.T.P./min, per gram of the starting material. The contact pressure inclusive of that of the diluent is usually 1 to 2 atom. although not limitative particularly.

In the process (b) of the invention, the reducing-and-carbonizing agent containing carbon atom or a mixture thereof with the reducing agent containing no carbon atom can be used as it is or as diluted. When the mixture is used, the mixing ratio of the reducing-and-carbonizing agent and the reducing agent is suitably selected but is preferably 1/0.05 to 1/5 by volume. Contact conditions are also suitably selected but the preferred contact temperature is about 250° to about 400° C., more preferably about 300° to about 400° C. The preferred contact time is about 0.5 to 6 hours when the contact in (a) is conducted, and about 1 to about 12 hours when the contact in (a) is not conducted. The preferred gas flow rate (excluding diluent) is about 1 to about 1000 ml S.T.P./min, more preferably about 5 to about 500 ml S.T.P./min, per gram of the starting iron compound. The contact pressure inclusive of that of the diluent is usually 1 to 2 atom. although not limitative particularly.

The particulate material obtained by the present process are in the form of generally uniform particles when observed under an electron microscope. The particles are present as primary particles and have the same particulate form as the starting particles of iron oxyhydroxide or iron oxide. The particles obtained by the process are found to contain carbon by elementary analysis and to contain an iron carbide by its X-ray diffraction pattern, which exhibits plane spacings at 2.28Å, 2.20Å, 2.08Å, 2.05Å and 1.92Å. Such pattern corresponds to $Fe_5C_2$. The iron carbide component of the present material chiefly comprises $Fe_5C_2$, with $Fe_2C$, $Fe_{20}C_9$ ($Fe_{2.2}C$), etc. present conjointly therewith in some cases. It is suitable to represent the iron carbide as $Fe_xC$ ($2 \leq x < 3$).

In the event of incomplete carbonization, the particles obtained by the present process further contain an iron oxide component which is chiefly $Fe_3O_4$. With respect to iron oxides, FeO, $Fe_3O_4$ and $\gamma$-$Fe_2O_3$ are generally related to one another in structure. The oxygen atoms in these three oxides are packed in a three-dimensional structure to the highest possible density, and the number of oxygen atoms in $Fe_3O_4$ actually present varies in an overall range covering the numbers of oxygen atoms in these oxides, so that it is suitable to represent the iron oxide in the particles by $FeO_y$ ($1 < y \leq 1.5$).

While the particles prepared by the present process contain iron oxide in addition to the iron carbide component in most cases, the elementary analysis values of C, H and N indicate that the amount of carbon is usually excess of that calculated from the chemical formula of the iron carbide identified by the X-ray diffraction pattern. It is not clear whether the excess of carbon is present as combined with iron or as free carbon. In this sense, it is probable that the particles obtained by the present process contain elemental carbon. The particles obtained by the present process then include particles at least 1.0 and less than 3.0 in average axial ratio with respect to their shape as primary particles and composed substantially of iron carbide alone or iron carbide and iron oxide and/or elemental carbon.

The iron carbide and iron oxide contents of the particles obtained by the present process can be determined from the chemical formulae $Fe_5C_2$ and $Fe_3O_4$, which are confirmed as the main iron carbide and iron oxide components by X-ray diffraction analysis, the result of elementary analysis and the weight gain on ignition. The iron carbide content is preferably at least 20 wt %, more preferably at least 50 wt %. The iron oxide content is preferably up to 70 wt %, more preferably up to 40 wt %.

In the invention, the iron carbide contains $Fe_5C_2$ as a main component and contains preferably about 80 to 100% by weight of $Fe_5C_2$.

The particles obtained by the present process are slightly smaller than but almost the same as the starting particles, namely iron oxyhydroxide or iron oxide, in average axial ratio and average particle size. Accordingly the particles prepared by the present process have an average axial ratio of at least 1.0 and less than 3.0, and an average particle size (long axis) of more than 0.1 $\mu$m and up to 5 $\mu$m.

The particles of the present invention containing iron carbide are useful as a magnetic material for magnetic recording as is apparent from the foregoing characteristics, etc., while the use thereof is not limited thereto. For example, the particulate material is usable as a catalyst for preparing lower aliphatic hydrocarbons from CO and $H_2$.

In the present invention, it is possible to produce a particle having a relatively high coercive force from an easily available starting iron compound.

The invention will be described below in detail with reference to examples.

In the following examples, characteristics, etc. are determined in the methods described below.

(1) Magnetic characteristics.

Determined in the following method unless otherwise specified.

Coercive force Hc, saturation magnetization ($\sigma_s$, e.m.u.) and remanent magnetization ($\sigma_r$, e.m.u.) are measured in a magnetic field with a strength of 5 kOe, using a gauss meter equipped with a Hall-effect element and the sample with a packing ratio of 0.2. (2) Elementary analysis for C, H and N The sample is subjected to elementary analysis in the conventional method using MT2 C H N CORDER Yanaco, product of Yanagimoto Mfg. Co., Ltd, with passage of oxygen (helium carrier) at 900° C.

(3) Determination of composition

The composition of the product is calculated from the chemical formulae of iron oxide and iron carbide determined by X-ray diffractometry, the elementary analysis value of C and the weight gain resulting from the following heat treatment. The calculation is conducted on the basis that $Fe_3O_4$, for example, changes into $Fe_2O_3$ having 1.035 times the weight of the former oxide and that $Fe_5C_2$ changes into $Fe_2O_3$ having 1.317 times the weight of the carbide. The weight gain is determined in the conventional method of heat treatment, i.e. by placing the sample in a platinum crucible, then heating the sample in a muffle furnace at 600° C. for 1 hour in the air and measuring the resulting weight gain after ascertaining the presence of $\alpha$-$Fe_2O_3$ by X-ray diffraction.

Stated more specifically, it is assumed that the proportions of $Fe_5C_2$, $Fe_3O_4$ and elemental carbon are x, y and z wt %, respectively, and that the carbon analysis value and the weight gain are A and B wt %, respectively. The values x, y and z are then given by the following equations.

$$x+y+z=100$$

$$1.317x+1.035y=100+B$$

$$z+0.079x=A$$

EXAMPLE 44

Two grams of goethite particles, 0.6 μm in average size (long axis) and 2 in average axial ratio, were placed into a porcelain boat, which was then inserted into a tubular furnace. After replacing the air in the furnace by nitrogen, the particles were heated to 300° C. and kept at this temperature for 2 hours while passing $H_2$ through the furnace at a flow rate of 100 ml/min. The particles were kept at this temperature for 1 hour while passing CO through the furnace at a flow rate of 100 ml/min. The particles were thereafter allowed to cool to room temperature to obtain a black powder.

The X-ray diffraction pattern of the product matched that of $Fe_5C_2$ Iron carbide on ASTM X-Ray Powder Data File 20-509. The results were given in Tables 1 and 2.

EXAMPLES 45 to 48

A black powder was prepared in the same manner as in Example 44 with use of the starting material and contact conditions listed in Table 8. The results were given in Tables 8 and 9.

TABLE 8

| | Starting material | | | Gas contacted | | Contact temp (°C.) | Contact time (hr) |
|---|---|---|---|---|---|---|---|
| Ex. | kind | particle size(μm) | axial ratio | kind | flow rate (ml/min) | | |
| 44 | α-FeOOH | 0.6 | 2 | $H_2$ | 100 | 300 | 2 |
| | | | | CO | 100 | 300 | 1 |
| 45 | α-FeOOH | 0.6 | 2 | $H_2$ | 100 | 300 | 2 |
| | | | | $CH_2=CH_2$ | 100 | 300 | 1 |
| 46 | α-FeOOH | 0.6 | 2 | $H_2$ | 100 | 300 | 2 |
| | | | | $C_3H_8$ | 100 | 300 | 1 |
| 47 | α-FeOOH | 0.6 | 2 | $H_2$ | 100 | 300 | 2 |
| | | | | $CH_3OH$ | 100 | 300 | 1 |
| 48 | α-FeOOH | 0.6 | 2 | $H_2$ | 100 | 300 | 2 |
| | | | | $HCOOCH_3$ | 100 | 300 | 1 |

TABLE 9

| | Product | | | | | | Composition (wt %) | | |
|---|---|---|---|---|---|---|---|---|---|
| Ex. | particle size(μm) | axial ratio | Hc | $\sigma_s$ | $\sigma_r$ | $\sigma_r/\sigma_s$ | $Fe_3O_4$ | $Fe_5C_2$ | C |
| 44 | 0.5 | 1.8 | 754 | 77.3 | 43.4 | 0.56 | 11 | 81 | 8 |
| 45 | 0.5 | 1.7 | 732 | 75.6 | 40.1 | 0.53 | 10 | 78 | 12 |
| 46 | 0.5 | 1.9 | 759 | 76.5 | 42.8 | 0.56 | 10 | 80 | 10 |
| 47 | 0.5 | 1.7 | 746 | 76.8 | 42.4 | 0.55 | 15 | 80 | 5 |
| 48 | 0.5 | 1.8 | 729 | 74.2 | 38.6 | 0.52 | 18 | 78 | 4 |

EXAMPLE 49

Two grams of goethite particles, 0.6 μm in average size (long axis) and 2 in average axial ratio, were placed into a porcelain boat, which was then inserted into a tubular furnace. After replacing the air in the furnace by nitrogen, the particles were heated to 300° C. and kept at this temperature for 2.5 hours while passing CO through the furnace at a flow rate of 100 ml/min. The particles were thereafter allowed to cool to room temperature to obtain a black powder.

The contact conditions and results were shown in Tables 10 and 11.

EXAMPLE 50

One gram of goethite particles, 0.6 μm in average size (long axis) and 2 in average axial ratio, were placed into a porcelain boat, which was then inserted into a tubular furnace. After replacing the air in the furnace by nitrogen, the particles were heated to 300° C. and kept at this temperature for 3 hours while passing CO through the furnace at a flow rate of 300 ml/min. The particles were thereafter allowed to cool to room temperature to obtain a black powder.

The contact conditions and results were shown in Tables 10 and 11.

EXAMPLE 51

α-FeOOH (3 g) was dehydrated at 600° C. for 1 hour to prepare α-$Fe_2O_3$. The α-$Fe_2O_3$ was reduced with $H_2$ at 400° C. for 1 hour and then oxidized in air at 350° C. for 1 hour to obtain γ-$Fe_2O_3$.

The $\gamma$-Fe$_2$O$_3$ was dispersed in 100 ml of 2% aqueous solution of cobalt sulfate with stirring. Thereto added an aqueous solution of NaOH to adjust a pH to 10 and the mixture was stirred at 80° C. for 30 minutes. The dispersion was filtered and dried to obtain $\gamma$-Fe$_2$O$_3$ coated with cobalt. Two grams of the particles were placed into a porcelain boat, which was then inserted into a tubular furnace. After replacing the air in the furnace by nitrogen, the particles were heated to 350° C. and kept at this temperature for 3 hours while passing CO through the furnace at a flow rate of 100 ml/min. The particles were thereafter allowed to cool to room temperature to obtain a black powder.

The contact conditions and results were shown in Tables 10 and 11.

EXAMPLES 52 to 55 AND REFERENCE EXAMPLE 7

Powdery products listed in Table 11 were prepared by contacting the starting iron compounds shown in Table 10 with a gas indicated in Table 10.

TABLE 10

| | Starting material | | | Gas contacted | | Contact temp (°C.) | Contact time (hr) |
|---|---|---|---|---|---|---|---|
| Ex. | kind | particle size(μm) | axial ratio | kind | flow rate (ml/min) | | |
| 49 | α-FeOOH | 0.6 | 2 | CO | 100 | 300 | 2.5 |
| 50 | α-FeOOH | 0.6 | 2 | CO | 300 | 300 | 3.0 |
| 51 | γ-Fe$_2$O$_3$ coated with Co | 0.3 | 1.8 | CO | 100 | 350 | 3.0 |
| 52 | γ-FeOOH | 0.5 | 1.5 | CO | 300 | 300 | 3.0 |
| 53 | α-Fe$_2$O$_3$ | 0.5 | 1.8 | CO/H$_2$ (3/7) | 300 | 400 | 3.0 |
| 54 | α-FeOOH | 0.6 | 2 | CH$_3$OH/H$_2$ (8/2) | 300 | 300 | 3.0 |
| 55 | α-FeOOH | 0.2 | 2 | CO | 100 | 300 | 2.5 |
| Ref. Ex 7 | α-FeOOH | 0.05 | 2 | CO | 100 | 300 | 2.5 |

TABLE 11

| | Product | | | | | | Composition (wt %) | | |
|---|---|---|---|---|---|---|---|---|---|
| Ex. | particle size(μm) | axial ratio | Hc | $\sigma_s$ | $\sigma_r$ | $\sigma_r/\sigma_s$ | Fe$_3$O$_4$ | Fe$_5$C$_2$ | C |
| 49 | 0.5 | 1.8 | 692 | 71.6 | 40.5 | 0.57 | 13 | 75 | 12 |
| 50 | 0.5 | 1.8 | 738 | 74.1 | 45.3 | 0.61 | 10 | 78 | 12 |
| 51 | 0.4 | 2.0 | 523 | 68.5 | 34.2 | 0.50 | 24 | 57 | 19 |
| 52 | 0.5 | 1.3 | 786 | 78.3 | 43.5 | 0.56 | 8 | 81 | 11 |
| 53 | 0.5 | 1.7 | 684 | 69.7 | 38.6 | 0.55 | 15 | 72 | 13 |
| 54 | 0.5 | 1.8 | 714 | 73.5 | 45.0 | 0.61 | 13 | 74 | 13 |
| 55 | 0.2 | 1.8 | 697 | 72.3 | 41.4 | 0.57 | 12 | 76 | 12 |
| Ref. Ex 7 | 0.05 | 1.8 | 705 | 73.2 | 43.6 | 0.60 | 10 | 78 | 12 |

EXAMPLE 56

Each of 15 g, 20 g or 25 g of powders obtained in Example 49, Example 55 and Reference Example 7 was added to a vihicle consisting of the following ingredients.
vinyl chloride-vinyl acetate copolymer: 5.25 g
dioctyl phthalate: 1.00 g
lauric acid: 0.2 g
toluene: 15.0 g
methyl isobutyl ketone: 15.0 g Each of the mixture was admixed in a 200-ml porcelain ball mill having 6 iron balls (each 15 mm diameter) incorporated therein at 30 r.p.m. for 6 hours.

The resulting coating composition was applied by a doctor knife to a polyethylene terephthalate film. Table 12 shows the mixing state of the composition.

TABLE 12

| Powder | Particle size (μm) | Axial ratio | Mixing state | | |
|---|---|---|---|---|---|
| | | | 15 g | 20 g | 25 g |
| powder of Ex. 6 | 0.6 | 1.8 | O | O | O |
| powder of Ex. 12 | 0.2 | 1.8 | O | O | O |
| powder of Ref. Ex. 1 | 0.05 | 1.8 | O | X | X |

Note:
O: composition is mixed homogeneously
X: composition is mixed heterogeneously and some of powders agglomerate

We claim:
1. A process for producing acicular primary particles having an average axial ratio of 3 to 20 and an average particle size of 0.1 to 2 μm, said particles containing an iron carbide, said iron carbide containing Fe$_5$C$_2$ as a main component, said process comprising contacting an acicular iron compound having a surface pH of at least 5 and selected from the group consisting of acicular iron oxyhydroxide and acicular iron oxide with a gas containing a component selected from the group consisting of CO and a mixture of CO and H$_2$ at a contact temperature of about 250° to about 400° C. at a gas flow rate of CO or mixture thereof with H$_2$ of about 1 to 1000 ml (STP)/min per gram of said acicular iron compound.

2. The process as defined in claim 1, wherein said iron oxyhydroxide is α-FeOOH, β-FeOOH or γ-FeOOH.

3. The process as defined in claim 1, wherein said iron oxyhydroxide is α-Fe$_2$O$_3$, γ-Fe$_2$O$_3$ or Fe$_3$O$_4$.

4. The process as defined in claim 1, wherein said iron oxyhydroxide is coated with sintering-preventing agent.

5. The process as defined in claim 1, wherein said contact temperature is about 300° to about 400° C.

UNITED STATES PATENT AND TRADEMARK OFFICE
CERTIFICATE OF CORRECTION

PATENT NO. : 4,842,759
DATED : June 27, 1989
INVENTOR(S) : Kazuo okamrea, et al.

It is certified that error appears in the above-identified patent and that said Letters Patent is hereby corrected as shown below:

Column 24, TABLE 6, "Ex. 1 - 5" should read --Ex. 39 - 43--.

Column 24, TABLE 7, "Ex. 1 - 5" should read --Ex. 39 - 43--.

Signed and Sealed this

Twenty-sixth Day of May, 1992

*Attest:*

DOUGLAS B. COMER

*Attesting Officer*  *Acting Commissioner of Patents and Trademarks*